United States Patent
Ohwada (10) Patent No.: US 8,105,998 B2
(45) Date of Patent: Jan. 31, 2012

(54) LIQUID COMPOSITION FOR REMOVING PHOTORESIST RESIDUE AND POLYMER RESIDUE

(75) Inventor: Takuo Ohwada, Saitama (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/311,951

(22) PCT Filed: Oct. 24, 2007

(86) PCT No.: PCT/JP2007/070691
§ 371 (c)(1),
(2), (4) Date: Oct. 8, 2009

(87) PCT Pub. No.: WO2008/050785
PCT Pub. Date: May 2, 2008

(65) Prior Publication Data
US 2010/0048443 A1 Feb. 25, 2010

(30) Foreign Application Priority Data

Oct. 24, 2006 (JP) ................................ 2006-289113

(51) Int. Cl.
*C11D 7/08* (2006.01)
(52) U.S. Cl. ........................ 510/175; 510/176; 134/1.3
(58) Field of Classification Search .................. 510/175, 510/176; 134/1.3
See application file for complete search history.

(56) References Cited

U.S. PATENT DOCUMENTS

| | | | |
|---|---|---|---|
| 5,334,332 A | 8/1994 | Lee | |
| 5,789,360 A | 8/1998 | Song et al. | |
| 6,110,834 A | 8/2000 | Kinoshita et al. | |
| 6,453,914 B2 * | 9/2002 | Torek et al. ................... | 134/1.2 |
| 2001/0051440 A1 * | 12/2001 | Torek et al. ................... | 438/745 |
| 2002/0037654 A1 | 3/2002 | Hayashi et al. | |
| 2002/0072235 A1 | 6/2002 | Haga et al. ................... | 438/689 |
| 2002/0139387 A1 * | 10/2002 | Yates ............................... | 134/1 |
| 2003/0222241 A1 * | 12/2003 | Torek et al. ................... | 252/79.1 |
| 2003/0230548 A1 * | 12/2003 | Sievert et al. .................... | 216/2 |
| 2004/0002020 A1 | 1/2004 | Oowada et al. | |
| 2005/0202987 A1 | 9/2005 | Small et al. | |
| 2005/0209118 A1 | 9/2005 | Kawamoto et al. | |
| 2006/0040838 A1 * | 2/2006 | Shimada et al. .............. | 510/175 |
| 2006/0046944 A1 | 3/2006 | Hata et al. | |
| 2006/0138399 A1 | 6/2006 | Itano et al. | |
| 2007/0105735 A1 * | 5/2007 | Suga et al. .................... | 510/175 |
| 2008/0041823 A1 * | 2/2008 | La et al. .......................... | 216/97 |
| 2008/0210900 A1 * | 9/2008 | Wojtczak et al. ............. | 252/79.3 |

(Continued)

FOREIGN PATENT DOCUMENTS

EP 0 662 705 A2 7/1995

(Continued)

*Primary Examiner* — Gregory Webb
(74) *Attorney, Agent, or Firm* — Wolf, Greenfield & Sacks, P.C.

(57) ABSTRACT

Provided is a liquid composition for, at a low temperature in a short time, removing a photoresist residue and a polymer residue generated in a semiconductor circuit element manufacturing process A residue removing method using such composition is also provided. The composition removes the photoresist residue and/or the polymer residue generated in the manufacturing process of a semiconductor circuit element having a metal wiring. The composition includes a fluorine compound of 0.5-3.0 mass % and water not over 30 mass %, and has a pH of 4 or less.

11 Claims, 2 Drawing Sheets

U.S. PATENT DOCUMENTS

| | | | |
|---|---|---|---|
| 2008/0318424 A1* | 12/2008 | Kawamoto et al. | 438/687 |
| 2009/0146101 A1* | 6/2009 | Huang et al. | 252/79.3 |

FOREIGN PATENT DOCUMENTS

| | | |
|---|---|---|
| EP | 0 918 081 A1 | 5/1999 |
| JP | 6-349785 A | 12/1994 |
| JP | 7-201794 A | 8/1995 |
| JP | 11-067703 A | 3/1999 |
| JP | 11-135473 A | 5/1999 |
| JP | 11-243085 A | 9/1999 |
| JP | 2001-005200 A | 1/2001 |
| JP | 2002-43274 A | 2/2002 |
| JP | 2002-202617 A | 7/2002 |
| JP | 2003-241400 A | 8/2003 |
| JP | 2003-280219 A | 10/2003 |
| JP | 2004-502980 A | 1/2004 |
| JP | 2004-157284 A | 6/2004 |
| JP | 2005-167181 A | 6/2005 |
| JP | 2005-173046 A | 6/2005 |
| JP | 2005-183525 A | 7/2005 |
| JP | 2006-66533 A | 3/2006 |
| WO | WO 2004/019134 A1 | 3/2004 |
| WO | WO 2004/100245 A1 | 11/2004 |

* cited by examiner

LIQUID COMPOSITION FOR REMOVING PHOTORESIST RESIDUE AND POLYMER RESIDUE

RELATED APPLICATIONS

This application is a national stage filing under 35 U.S.C. § 371 of PCT International application PCT/JP2007/070691, filed Oct. 24, 2007.

TECHNICAL FIELD

The present invention relates to a composition for removing photoresist residues and polymer residues remained after dry etching and after ashing in a manufacturing process of semiconductor circuit elements having metal wiring, and to a method for removing the residues using the composition.

BACKGROUND ART

In a manufacturing process of semiconductor circuit elements, dry etching is conventionally performed to form via holes in an interlayer insulating film formed on a substrate using a photoresist pattern as a mask, or to pattern a film of wiring material such as aluminum. As a conventional post-processing of dry etching, the photoresist pattern is removed by ashing, then photoresist residues and polymer residues remained partially on the treated surface are removed by an exclusive removing liquid (residue-removing liquid composition). Here, photoresist residues refer to incomplete ashed products such as photoresists and antireflection coatings remained on the substrate surface after ashing that is performed after dry etching, and polymer residues refer to by-products during dry etching, which include fluorocarbon deposits derived from an etching gas, remained as a by-product on the wall surface of the etched material, side-wall polymers (also called as side-wall protection film and rabbit ear) derived from a compound of wiring material and etching gas, and organic metal polymers and metal oxides remained on the side wall and bottom of via holes.

As conventional liquids for removing a photoresists residue and a polymer residue, in cases where wiring material is aluminum or aluminum alloys, a composition consisting of "fluorine compound+quaternary ammonium compound+water" or "fluorine compound+quaternary ammonium compound+organic solvent+water" and a composition consisting of "hydroxylamine+alkanolamine (+solvent)" are proposed (for example, refer to Patent Literatures 1 and 2). These compositions have low corrosiveness to aluminum or aluminum compounds, and they can be applied to either after the formation of metal wiring or after the formation of via holes or contact holes; however, they require long time of treatment such as 20-30 min in order to remove residues completely. Accordingly, these compositions cannot be applied to single wafer cleaning apparatuses which have been progressively introduced in residue-removal processes and which require low-temperature short-time processing (as a guide, processing temperature is around 25-40° C., and processing time is around 1-3 min).

Furthermore, in recent years, when using a single wafer cleaning apparatus, attempts have been made to remove polymer residues remained after dry etching of aluminum or aluminum alloys upon wiring formation, and photoresist residues and polymer residues remained after dry etching of interlayer insulating films upon formation of via holes, using a single liquid composition for removing a photoresists residue and a polymer residue. For example, a composition consisting of "quaternary ammonium compound+hydrogen peroxide+water" or "carboxylate+hydrogen peroxide+water" has been reported (for example, refer to Patent Literature 3 and Patent Literature 4). When used individually, these compositions are reported to be capable of removing photoresist residues simultaneously with polymer residues mainly comprised of titanium oxides remained at the bottom and side walls of via holes, when the bottom of the via holes is TiN. However, any of these compositions contain hydrogen peroxide; when the content of hydrogen peroxide is high, aluminum or aluminum alloy is corroded; when the content of hydrogen peroxide is low, then polymer residues mainly comprised of titanium oxides cannot be removed and applicable processing temperature and processing time are restricted. In addition, oxidizing agents tend to decompose easily and the temporal stability of the compositions themselves becomes a problem.

As composition without hydrogen peroxide, a composition consisting of "acid+inorganic salt" has been reported. As an example of compositions in which fluorine compound is combined with acids, a composition consisting of "fluorine compound+sulfuric acid+hydrogen peroxide or ozone+water" has been reported to be capable of removing photoresist residues and polymer residues at low temperature under short processing time, which also has a weak corrosive action on aluminum alloys (for example, refer to Patent Literature 5). However, these compositions do not show sufficiently weak corrosive actions on aluminum or aluminum alloys in actual application to single wafer cleaning apparatuses, and the concentration of the fluorine compound is low, such as 100 ppm at maximum; accordingly, the removal of photoresist residues remained on the surface of interlayer insulating films upon formation of via holes and polymer residues containing titanium oxides remained at the bottom of via holes and their surroundings is not sufficient. Moreover, hydrogen peroxide or ozone is easy to be decomposed, so that the temporal stability of the composition itself becomes a problem.

The present inventor and colleagues have reported that a composition consisting of "inorganic fluorine compound+inorganic acid" can also remove photoresist residues and polymer residues at low temperature with short processing time, and that the composition has a weak corrosive action on aluminum alloys (for example, refer to Patent Literature 6). Since this composition does not contain hydrogen peroxide or ozone, its corrosive action on aluminum alloys is weaker than that of the composition containing "fluorine compound+sulfuric acid+hydrogen peroxide or ozone+water", so that temporal stability of the former composition is superior; however, because its content of inorganic fluorine compound is 0.01-0.05 mass %, it cannot sufficiently remove photoresist residues remained on the surface of interlayer insulating films upon formation of via holes and polymer residues containing titanium oxides remained at the bottom of via holes and their surroundings. Furthermore, the present inventor and a colleague reported a composition consisting of "fluorine compound (excluding hydrofluoric acid) and sulfonic acid" (for example, refer to Patent Literature 7). This composition has high content of a fluorine compound, and by using organic sulfonic acid, its capability of removing photoresist residues on the surface of via-hole patterns upon formation of the patterns has been successfully improved, compared to that of the above-mentioned composition consisting of "inorganic fluorine compound+inorganic acid," but its capability of removing titanium oxide at the bottom of via holes and their surroundings is still insufficient. To remove polymer residues containing titanium oxides using such a composition, the contents of fluorine compound and sulfonic acid should be increased; in this case however, its corrosive action on interlayer insulating films and aluminum alloys would be significantly enhanced.

Meanwhile, as a composition to remove photoresist residues and polymer residues formed in dry etching upon formation of substrates without wiring, compositions such as "sulfuric acid 5-7+hydrofluoric acid 1/400-1/1000 (volume ratio)", "sulfuric acid 5-7+hydrogen peroxide 1+hydrofluoric acid 1/400-1/1000 (volume ratio)" have been reported; however, since the contents of water and hydrofluoric acid are low, removal of photoresist residues under low-temperature processing is not sufficient, and under high-temperature processing, various metal-wiring materials are corroded (for example, refer to Patent Literature 8).

Other than the above, a composition consisting of "ammonium fluoride+organic acid+water" has been reported (for example, refer to Patent Literature 9); however, there is a concern regarding deterioration of workability due to odor of acetic acid used as the organic acid. A composition consisting of "fluorine compound+acids having a reducing character" is also able to remove photoresist residues and polymer residues at low temperature and in a short time and has a weak corrosive action on copper, copper alloys and low-dielectric-constant films (for example, refer to Patent Literature 10); however, it does not have sufficient capability of corrosion prevention of aluminum and aluminum alloys.

As an example of compositions wherein fluorine compound is combined with acids and organic solvent, a composition consisting of "fluorine compound+ascorbic acid+polar organic solvent" (for example, refer to Patent Literature 11) has been reported; however, because ascorbic acid itself decomposes with time in an aqueous solution, the composition is not practically applicable. While a composition consisting of "fluorine compound+orthoboric acid or orthophosphoric acid+aqueous organic solvent" (for example, refer to Patent Literature 12) aims to remove photoresist residues and polymer residues upon formation of via holes, actually its ability of removing resist residues and polymer residues containing titanium oxides is too low. In addition, this composition exhibits a strong corrosive action on metals such as aluminum, when its contents of water and fluorine compound are increased in order to increase its ability to remove polymer residues. Furthermore, a liquid composition for removing a photoresists residue and a polymer residue consisting of "fluorine compound+sulfonic acid buffer+aqueous organic solvent" (for example, refer to Patent Literature 13) has a weak corrosive action on copper, but there is no description regarding its capability of corrosion prevention of aluminum, etc.

While this is not a liquid composition for removing a photoresists residue and a polymer residue after dry etching, there is a report on a surface-treatment agent for the surface of a polysilicon film formed on an insulating substrate made of glass, etc. using laser annealing method, consisting of "0.01-0.5 mass % of hydrofluoric acid or 0.5-5 mass % of ammonium fluoride+50.0-80.0 mass % of nitric acid" (for example, refer to Patent Literature 14); however, with 0.01-0.5 mass % of the hydrofluoric acid, the removal of photoresist residues is not sufficient. Furthermore, in examples of this literature, there is only a description of composition with a nitric acid content of 50.0-70.0 mass %; however, since the water content is too large with this range of composition, corrosion of metals such as aluminum, etc. becomes obvious.

As described above, to date there is no example in which a single liquid composition for removing a photoresists residue and a polymer residue has both a good removing property to remove photoresist residues and polymer residues (in particular, polymer residues containing titanium oxides) by a low-temperature and short-time processing using a single wafer cleaning apparatus, and a capability of corrosion prevention of metal wiring. Therefore, development of a liquid composition for removing a photoresists residue and a polymer residue having these characteristics has been desired.

Patent Literature 1: JP A No. 7-201794
Patent Literature 2: U.S. Pat. No. 5,334,332
Patent Literature 3: JP A No. 2002-202617
Patent Literature 4: JP A No. 2005-183525
Patent Literature 5: JP A No. 11-243085
Patent Literature 6: JP A No. 2005-173046
Patent Literature 7: JP A No. 2006-66533
Patent Literature 8: JP A No. 11-135473
Patent Literature 9: JP A No. 6-349785
Patent Literature 10: JP A No. 2003-280219
Patent Literature 11: JP A No. 2001-5200
Patent Literature 12: JP A No. 11-67703
Patent Literature 13: JP A No. 2003-241400
Patent Literature 14: JP A No. 2002-43274

DISCLOSURE OF INVENTION

Problems to Be Solved by Invention

Therefore, an object of the present invention is to provide a liquid composition for removing a photoresists residue and a polymer residue what removes photoresist residues and polymer residues generated in a manufacturing process of semiconductor circuit elements, and a method for removing the residues using such composition; in particular, the object is to provide a liquid composition for removing a photoresists residue and a polymer residue that removes, by a low-temperature and short-time processing, polymer residues containing aluminum oxide after formation of metal wiring, as well as photoresist residues and polymer residues containing silicon oxide and titanium oxide after formation of via holes, wherein the composition also has a capability of corrosion prevention of metal wiring and can be used in sheet-fed cleaning, and a method for removing the residues using such composition.

Means for Solving Problems

While the present inventor devoted themselves to the study to solve the above problems, he found that with respect to a liquid composition for removing a photoresists residue and a polymer residue that contains a fluorine compound, it is appropriate that the composition comprises the fluorine compound of a certain amount or larger, and has a hydrogen ion concentration (pH) of 4 or less, in order to remove polymer residues containing titanium oxides. However, interlayer insulating films and aluminum or aluminum alloys are significantly corroded with this condition; therefore, by controlling the water content in the composition, the corrosion of the interlayer insulating films and aluminum or aluminum alloys can be inhibited. In concrete terms, the inventors found the followings: by suppressing the water content in the composition to 30.0 mass % or less, dissociation of the fluorine compound can be inhibited and the prevention of corrosion of metal wiring comprising aluminum alloys, etc. and interlayer insulating films comprising silicon oxides can be improved, thereby enabling application of the composition to a single wafer cleaning apparatus with which low-temperature and short-time processing is indispensable. Thus, the present invention has been achieved.

Namely, the present invention relates to a composition for removing a photoresist residue and/or a polymer residue generated in a manufacturing process of semiconductor circuit elements having metal wiring, wherein the composition comprises 0.5-3.0 mass % of a fluorine compound and 30 mass % or less of water, and has a pH value of 4 or less.

In addition, the invention relates to said composition wherein the fluorine compound is one or more kinds selected from the group consisting of hydrofluoric acid, hexafluorosilicic acid, and tetrafluoroboric acid.

Furthermore, the invention relates to said composition comprising one or more inorganic acids and/or organic acids.

In addition, the invention relates to said composition wherein the inorganic acid and/or organic acid is any one of (1) sulfuric acid, (2) phosphoric acid, (3) nitric acid, (4) sulfuric acid and hydrochloric acid, (5) sulfuric acid and perchloric acid, (6) sulfuric acid and tetraboric acid, (7) aliphatic carboxylic acid, (8) aliphatic carboxylic acid and phosphoric acid, (9) aliphatic sulfonic acid, or (10) aliphatic sulfonic acid and phosphoric acid.

Furthermore, the invention relates to said composition wherein the total amount of the inorganic acids and/or organic acids is 70 mass % or more.

Furthermore, the invention relates to said composition wherein the metal wiring is one or more kinds selected from the group consisting of aluminum, copper, tungsten, titanium, and an alloy having these metals as a major component.

In addition, the invention relates to a method for removing a photoresist residue and/or a polymer residue generated in a manufacturing process of semiconductor circuit elements having metal wiring, using the composition according to any one of claims 1 to 6.

Advantageous Effects of Invention

The liquid composition for removing a photoresists residue and a polymer residue of the present invention, when used alone, is capable of dissolving all of the following residues under low temperature in a short time, by comprising a certain amount of a fluorine compound and by adjusting the pH value of the composition to 4 or less: 1) photoresist residues, 2) polymer residues containing aluminum oxides remained after formation of wiring of aluminum alloys, etc. and 3) polymers containing titanium oxides, remained on the surface of a titanium alloy at the bottom of via holes and their surrounding via-hole walls after formation of the via holes. Furthermore, by adjusting the water content of the composition to be not exceeding 30 mass %, i.e., at 30.0 mass % or less, dissociation of the fluorine compound is suppressed and HF condition is maintained, thereby preventing corrosion of metal wiring and interlayer insulating films. Accordingly, photoresist residues and polymer residues can be removed at low temperature in a short time, without corroding metal wiring and interlayer insulating films.

Although the mechanism realizing the above effects is not thoroughly clarified, it is considered as follows.

The fluorine compound contained in an aqueous solution of acidic fluorine compound which comprises an excess amount of water, is dissociated as follows.

$2HF \rightarrow H^+ + HF_2^-$ $HF_2^-$ is an active species that dissolves metal wiring comprising aluminum alloys, etc. and an interlayer insulating film comprising silicon oxide. In this case, the capability of the composition to remove polymer residues containing aluminum oxide and polymer residues containing titanium oxide is high, however at the same time, the composition strongly corrodes metal wiring and interlayer insulating films.

To inhibit corrosion of metal wiring and interlayer insulating films, it is appropriate to increase pH of the composition. The amount of $HF_2^-$ decreases with an increase of pH, and almost no aluminum alloys and no silicon oxide dissolve in the neutral pH range. However, at the same time, amounts of removal of polymer residues containing aluminum oxide and polymer residues containing titanium oxide decrease.

Accordingly, polymer residues containing metal oxides cannot be removed by a composition containing a fluorine compound, unless its pH is acidic. In particular, polymer residues containing titanium oxide are hard to dissolve compared to residues containing aluminum oxide, thus requiring a certain amount of a fluorine compound. In concrete terms, the pH value should be 4 or less and the content of a fluorine compound should be 0.5 mass % or more.

Using the fluorine compound solution of these conditions, in order to improve its capability of corrosion prevention of metal materials such as aluminum alloys, it is effective to decrease the water content of the composition. By adjusting the water content, the ratio of the concentration of $HF_2^-$ (in a dissociation state) to the concentration of HF (in a non-dissociation state) in the composition can be adjusted to an appropriate value, thereby achieving both the removal of photoresist residues and polymer residues, and the prevention of corrosion of metal wiring comprising aluminum alloys, etc. and interlayer insulating films comprising silicon oxide, etc.

The photoresist residue-removing liquid composition of the present invention exhibits the following effects that cannot be achieved by conventional technologies, by means of combining a fluorine compound with water, appropriating the compounding ratio of each component and pH values, in particular by adjusting the water content: that is, the effects such as the improvement in the capability of removing photoresist residues and polymer residues, in particular polymer residues containing titanium oxide, and the inhibition of corrosion of metal wiring comprising aluminum or aluminum alloys and interlayer insulating films comprising silicon oxide; moreover the inventive composition has superior temporal stability due to not containing an oxidizing agent such as hydrogen peroxide.

Accordingly, the liquid composition for removing a photoresists residue and a polymer residue of the present invention is capable of removing photoresist residues and polymer residues generated by ashing of photoresists after dry etching, during a process of making wiring comprising aluminum or aluminum alloys on a substrate surface, and during a process of forming via holes that connect these wiring lines and forming contact holes that connect a transistor layer with these wiring lines, using a single wafer cleaning apparatus which requires low-temperature and short time processing.

DESCRIPTION OF EMBODIMENTS

Embodiments of the present invention are described below.

The liquid composition for removing a photoresists residue and a polymer residue described here is those used for removing polymer residues containing aluminum oxide after formation of metal wiring, photoresist residues after formation of via holes, and polymer residues containing silicon oxide or titanium oxide, wherein said composition comprises 0.5-3.0 mass % of a fluorine compound and 30 mass % or less of water, and has a pH value of 4 or less.

In concrete terms, examples of metal wiring include those comprising a metal consisting of aluminum, copper, tungsten, titanium and alloys that contain those metals as major components.

Although the liquid composition for removing a photoresists residue and a polymer residue of the present invention is a composition comprising a fluorine compound which easily dissolves aluminum in general, the inventive composition can inhibit corrosion of titanium and aluminum-copper alloys. Since tungsten has high corrosion resistance under acidic conditions, the inventive liquid composition for removing a photoresists residue and a polymer residue is capable of inhibiting the corrosion of any of titanium, aluminum, copper, tungsten and alloys having these metals as major components, and the composition is preferably used for them.

Examples of the fluorine compound used in the inventive liquid composition for removing a photoresists residue and a polymer residue include hydrofluoric acid, ammonium fluoride, acidic ammonium fluoride and hexafluorosilicic acid, and tetrafluoroboric acid. Hydrofluoric acid is preferred.

One or more kinds of fluorine compounds may be combined in the composition.

When the content of the fluorine compound is increased, while the capability of removing photoresist residues and polymer residues increases, the corrosive action on the above metals and interlayer insulating films such as silicon oxide, etc. also increases; when the content of the fluorine compound is decreased, the capability of removing photoresist residues and polymer residues as well as the corrosive action on the above metals and interlayer insulating films decrease. Accordingly, the content of the fluorine compound is determined with consideration given to contents of other acids and water contained, and based on the capability of removing photoresist residues and polymer residues, and the corrosive action on the above metals and interlayer insulating films; the content is 0.5-3.0 mass %, and preferably 0.5-2.0 mass %.

In the liquid composition for removing a photoresists residue and a polymer residue of the present invention, the hydrogen-ion concentration (pH) is adjusted to be 4 or less. When the pH value of the liquid composition for removing a photoresists residue and a polymer residue is high, the capability of removing polymer residues containing titanium oxide of via-hole patterns decreases; therefore, considering the contents of acids and water contained, the hydrogen-ion concentration (pH) is appropriately determined based on the capability of removing photoresist residues and polymer residues, and the corrosive action on the above metals and interlayer insulating films; the pH value is 4 or less, and preferably 2 or less. By using such a range, photoresist residues and polymer residues can be removed. Adjustment of pH is, in concrete terms, performed using one or more kinds of organic acids and/or inorganic acids.

As the organic acids and inorganic acids used in the inventive liquid composition for removing a photoresists residue and a polymer residue, any of those which can adjust the pH value to 4 or less can be used. Concrete examples include sulfonic acid, carboxylic acid, phosphoric acid, nitric acid, hydrochloric acid, perchloric acid and the like. Sulfonic acid and carboxylic acid are preferred, and sulfonic acid is more preferred. Examples of sulfonic acid include sulfuric acid, methanesulfonic acid, ethanesulfonic acid, and trifluoromethanesulfonic acid; examples of carboxylic acid include acetic acid, propionic acid, methoxyacetic acid and lactic acid.

When sulfonic acid is used as the acid that is combined with a fluorine compound, it shows a characteristic of strong corrosion prevention of aluminum and aluminum alloys. A reason for this characteristic has not been clarified, but it is speculated as follows: sulfonic acid reacts with aluminum on the surface of aluminum oxide on the outermost wiring surface due to partial complexation between a sulfonic group in the sulfonic acid and aluminum, or due to electrical absorption, so that the contact of $HF_2^-$ that forms a soluble complex is prevented and the progression of corrosion is inhibited. As the sulfonic acid, sulfuric acid or methanesulfonic acid is preferred.

The acids used in the present invention may be carboxylic acid, in addition to sulfonic acid.

When carboxylic acid is used as the acid that is combined with a fluorine compound, the resulting composition has been found to have superior capability of removing photoresist residues and polymer residues even when water content is decreased to a level at which the capability of corrosion prevention of aluminum or aluminum alloys can be maintained. The reason for this has not been clarified, but it is speculated as follows: because carboxyl groups are not dissociated due to the low water content, they are not electrically adsorbed on the surface of aluminum and aluminum alloys, therefore they do not inhibit the contact of the fluorine compound with photoresist residues and polymer residues. Furthermore, different from sulfonic acids, carboxylic acid generates almost no heat upon mixture with water, so that it requires no cooling process during manufacturing process, and the manufacturing process can be simplified.

As the aliphatic carboxylic acid used in the present liquid composition for removing a photoresists residue and a polymer residue, carboxylic acid with a carbon number of 1-6 is preferred when water solubility is considered; examples include formic acid, acetic acid, propionic acid, methoxyacetic acid, lactic acid, and n-hexanoic acid. In addition, carboxylic acid with a carbon number of 2-3 is preferred, such as acetic acid, propionic acid, methoxyacetic acid and lactic acid. These aliphatic carboxylic acids can be mixed with water, and they can be fairly easily obtained.

Thus, an acid used may be appropriately selected depending on the application.

Regarding the inventive liquid composition for removing a photoresists residue and a polymer residue, an inorganic compound such as phosphoric acid, diphosphorus pentaoxide, boric acid, nitric acid, hydrochloric acid and perchloric acid can be added to the solution in which a fluorine compound is combined with sulfonic acid or carboxylic acid. Since phosphoric acid and diphosphorus pentaoxide dissolve aluminum oxide, their addition can improve the capability of removing polymer residues in wiring patterns. Boric acid reacts with fluorine contained in the fluorine compound at a ratio of 1:4 and forms tetrafluoroboric acid that has a low solubility to silicon oxide; therefore, its addition may reduce damages to interlayer insulating films such as silicon oxide. Since nitric acid, hydrochloric acid and perchloric acid have high solubility to metal oxides such as titanium oxide, their addition may improve the capability of removing polymer residues in via-hole patterns.

Particularly preferred acids and their combination include (1) sulfuric acid, (2) phosphoric acid, (3) nitric acid, (4) sulfuric acid and hydrochloric acid, (5) sulfuric acid and perchloric acid, (6) sulfuric acid and tetraboric acid, (7) aliphatic carboxylic acid, (8) aliphatic carboxylic acid and phosphoric acid, (9) aliphatic sulfonic acid, or (10) aliphatic sulfonic acid and phosphoric acid.

The content of the acid such as sulfonic acid does not significantly affect the capability of removing photoresist residues and polymer residues as well as the corrosive action on each material; however, when the content is too small, the capability of removing photoresist residues and polymer residues in via-hole patterns as well as the capability of corrosion prevention of aluminum or aluminum alloys decrease. Therefore, the content of the acid used should be appropriately determined by considering the amount of acids contained and water content, and based on the capability of removing photoresist residues and polymer residues and the corrosive action on the above metals and interlayer insulating films. Their total amount is preferably 30.0 mass % or more, and more preferably 40.0 mass % or more, and particularly preferably 70.0 mass % or more.

When the water content of the liquid composition for removing a photoresists residue and a polymer residue is high, the capability of removing photoresist residues in via-hole patterns decreases and the corrosive action on metals such as aluminum or aluminum alloys and titanium alloys as well as interlayer insulating films such as silicon oxide increases; therefore, the water content of the liquid composition for removing a photoresists residue and a polymer residue of the present invention is set at not exceeding 30 mass %, i.e., 30 mass % or less. When the capability of removing polymer residues containing aluminum oxide of wiring patterns and polymer residues containing titanium oxide of via-hole patterns is considered, the water content is preferably 3.0-30.0 mass %, and more preferably 7.0-25.0 mass %.

EXAMPLES

Next, with respect to the inventive liquid composition for removing a photoresists residue and a polymer residue, the present invention will be described in more detail with reference to examples and comparative examples; however, the present invention is not limited to these examples.

<Method for Preparing Liquid Composition for Removing a Photoresists Residue and a Polymer Residue, (Containing Sulfonic Acid) (i)>

(1) In ultra-pure water weighed in accordance with the feeding amount, sulfonic acid weighed in accordance with the feeding amount was introduced in drops by a small amount while stirring, and the mixture was stirred until it became homogenous (solution A) During this process, when temperature of the solution significantly increases due to the heat of dilution during dropping of the sulfonic acid, the solution is ice-cooled.

(2) In the case of composition comprising an acid other than sulfonic acid and a fluorine compound, the acid weighed in accordance with the feeding amount was introduced into the solution A, then the solution was stirred until it became homogenous (solution A').

(3) A fluorine compound weighed in accordance with the feeding amount was introduced into the solution A or solution A', then the solution was stirred until it became homogenous (solution B)

<Method for Preparing Liquid Composition for Removing a Photoresists Residue and a Polymer Residue, (Containing Carboxylic Acid) (ii)>

(1) In ultra-pure water weighed in accordance with the feeding amount, carboxylic acid weighed in accordance with the feeding amount was mixed and the mixture was stirred until it became homogenous (solution C).

(2) In the case of composition comprising an acid other than carboxylic acid and a fluorine compound, the acid weighed in accordance with the feeding amount was introduced into the solution C, then the solution was stirred until it became homogenous (solution C').

(3) A fluorine compound weighed in accordance with the feeding amount was introduced into the solution C or solution C', then the solution was stirred until it became homogenous (solution D).

<Evaluation>

In wafers used for evaluation, each of an Al—Cu wiring pattern and a via-hole pattern was produced; and the removal capability of the liquid compositions for removing a photoresists residue and a polymer residue having composition ratios listed in examples 1-49 and comparative examples 1-34, and their corrosive action on each material (Al—Cu, TiN, Ti, $SiO_2$) were evaluated.

Figure 1:
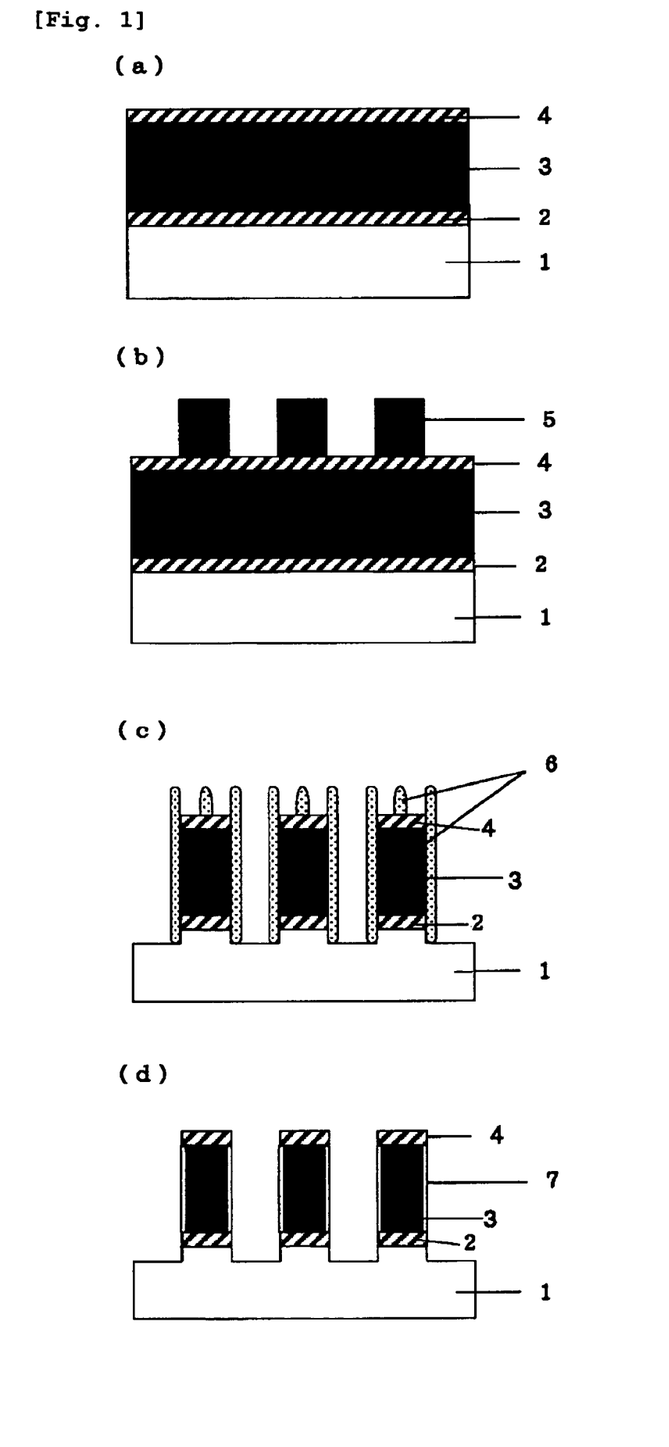
FIG. 1 shows a manufacturing process of a semiconductor circuit element (Al wiring pattern) which uses the liquid composition for removing a photoresists residue and a polymer residue of the present invention.

Evaluation Using Al—Cu Wiring Pattern (FIG. 1)

Onto a wafer in which a barrier metal (TiN/Ti) layer 2, a metal (Al—Cu) layer 3, and a barrier metal (TiN/Ti) layer 4 were formed on an underlying oxide film ($SiO_2$) 1, a photoresist mask 5 was formed with patterning by coating, exposure and development, and the wafer was subjected to dry etching, and the mask (photoresist) 5 after etching was subjected to ashing; then the wafer was treated by being immersed into each of the residue-removing liquid compositions of examples 1-49 and comparative examples 1-34 at 25° C. for 60 s, then rinsed with flowing ultra-pure water and dried. With respect to the Al—Cu wiring patterns obtained, the capability of removing photoresist residues and polymer residues, as well as the corrosive action on each material (Al—Cu, TiN, Ti, $SiO_2$) were evaluated using an electron microscope.

Figure 2:
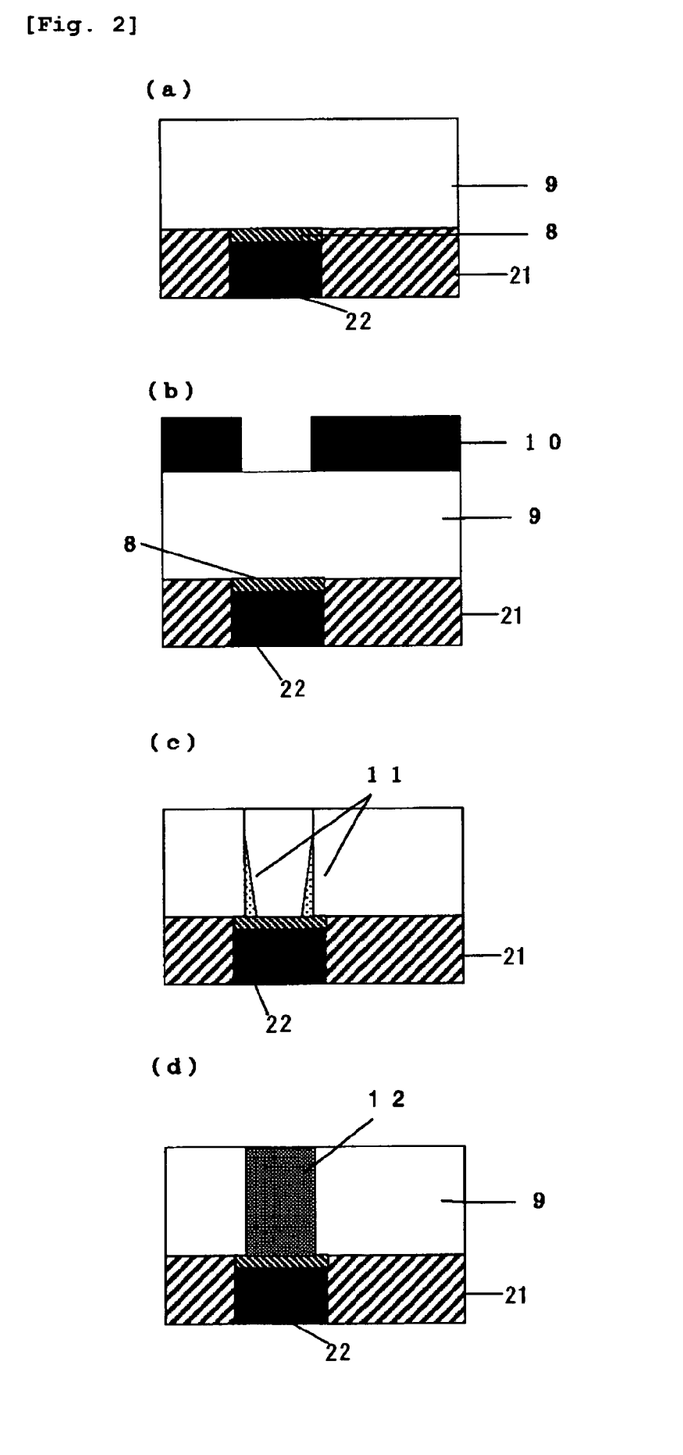
FIG. 2 shows a manufacturing process of a semiconductor circuit element (via-hole pattern) which uses the liquid composition for removing a photoresists residue and a polymer residue of the present invention.

Evaluation Using Via-Hole Pattern (FIG. 2)

Onto a wafer in which embedded wiring (Al—Cu) 22 and a barrier metal (TiN/Ti) layer 8 were formed in a wiring gutter of an insulating film ($SiO_2$) 21, and an interlayer insulating film 9 was formed on the insulating film 21, a photoresist mask 10 was formed with patterning by coating, exposure and development, and via holes were formed by dry etching, and the mask (photoresist) 10 after etching was subjected to ashing; then the wafer was treated by being immersed into each of the residue-removing liquid compositions of examples 1-49 and comparative examples 1-34 at 25° C. for 60 s, then rinsed with flowing ultra-pure water and dried. With respect to via-hole patterns obtained, the capability of removing photoresist residues and polymer residues, as well as the corrosive action on materials (Al—Cu, TiN, Ti, $SiO_2$) were evaluated using an electron microscope.

Tables 1-5 show the composition ratios of comparative examples and examples, and tables 6-10 show respective evaluation results.

TABLE 1

Composition containing sulfuric acid or phosphoric acid and water.

Composition ratio of the residue-removing liquid composition

| | Component ① | mass % | Component ② | mass % | Component ③ | mass % | Component ④ | mass % | pH |
|---|---|---|---|---|---|---|---|---|---|
| Example 1 | $H_2SO_4$ | 92.5 | HF | 3.000 | | | Water | 4.5 | <1 |
| Example 2 | $H_2SO_4$ | 92.5 | HF | 0.500 | | | Water | 7.0 | <1 |
| Example 3 | $H_2SO_4$ | 90.0 | HF | 2.000 | | | Water | 8.0 | <1 |

TABLE 1-continued

Composition containing sulfuric acid or phosphoric acid and water.

Composition ratio of the residue-removing liquid composition

| | Component ① | mass % | Component ② | mass % | Component ③ | mass % | Component ④ | mass % | pH |
|---|---|---|---|---|---|---|---|---|---|
| Example 4 | $H_2SO_4$ | 90.0 | HF | 1.000 | | | Water | 9.0 | <1 |
| Example 5 | $H_2SO_4$ | 90.0 | HF | 0.500 | | | Water | 9.5 | <1 |
| Example 6 | $H_2SO_4$ | 85.0 | $H_2SiF_6$ | 0.500 | | | Water | 14.5 | <1 |
| Example 7 | $H_2SO_4$ | 85.0 | $HBF_4$ | 0.500 | | | Water | 14.5 | <1 |
| Example 8 | $H_3PO_4$ | 85.0 | HF | 0.500 | | | Water | 14.5 | <1 |
| Example 9 | $H_2SO_4$ $H_3PO_4$ | 85.0 2.000 | HF | 0.500 | | | Water | 12.5 | <1 |
| Example 10 | $H_2SO_4$ $P_2O_5$ | 85.0 2.000 | HF | 0.500 | | | Water | 12.5 | <1 |
| Example 11 | $H_2SO_4$ $H_3BO_3$ | 85.0 2.000 | HF | 0.500 | | | Water | 12.5 | <1 |
| Example 12 | $H_2SO_4$ HCl | 85.0 2.000 | HF | 0.500 | | | Water | 12.5 | <1 |
| Example 13 | $H_2SO_4$ $HNO_3$ | 85.0 2.000 | HF | 0.500 | | | Water | 12.5 | <1 |
| Example 14 | $H_2SO_4$ $HClO_4$ | 85.0 2.000 | HF | 0.500 | | | Water | 12.5 | <1 |
| Example 15 | $H_2SO_4$ | 80.0 | HF | 0.500 | | | Water | 19.5 | <1 |
| Example 16 | $H_2SO_4$ | 70.0 | HF | 0.500 | | | Water | 29.5 | <1 |
| Comparative example 1 | $H_2SO_4$ | 95.5 | HF | 0.250 | | | Water | 4.25 | <1 |
| Comparative example 2 | $H_2SO_4$ | 95.0 | HF | 0.400 | | | Water | 4.6 | <1 |
| Comparative example 3 | $H_3PO_4$ | 95.0 | HF | 0.400 | | | Water | 4.6 | <1 |
| Comparative example 4 | $H_2SO_4$ | 65.0 | HF | 0.400 | | | Water | 34.6 | <1 |
| Comparative example 5 | $H_2SO_4$ | 65.0 | HF | 3.500 | | | Water | 31.5 | <1 |
| Comparative example 6 | $H_3PO_4$ | 65.0 | HF | 0.400 | | | Water | 33.0 | <1 |
| Comparative example 7 | $H_3PO_4$ | 65.0 | HF | 2.000 | | | Water | 33.0 | <1 |
| Comparative example 8 | $H_2SO_4$ | 50.0 | HF | 0.400 | | | Water | 49.6 | <1 |
| Comparative example 9 | $H_2SO_4$ | 50.0 | HF | 3.500 | | | Water | 46.5 | <1 |
| Comparative example 10 | $H_2SO_4$ | 30.0 | HF | 0.400 | | | Water | 69.6 | <1 |
| Comparative example 11 | $H_2SO_4$ | 30.0 | HF | 3.500 | | | Water | 66.5 | <1 |
| Comparative example 12 | $H_2SO_4$ | 7.5 | HF | 0.009 | | | Water | 92.491 | <1 |
| Comparative example 13 | $H_2SO_4$ | 7.5 | HF | 0.009 | $H_2O_2$ | 7.5 | Water | 84.991 | <1 |
| Comparative example 14 | $H_3BO_3$ | 0.300 | $NH_4F$ | 1.000 | DMF[※2] | 69.0 | Water | 29.7 | <1 |

[※2] Dimethylformamide

TABLE 2

Composition consisting of sulfuric acid, hydrofluoric acid and water.

Composition ratio of the residue-removing liquid composition

| | Component ① | mass % | Component ② | mass % | Component ③ | mass % | Component ④ | mass % | pH |
|---|---|---|---|---|---|---|---|---|---|
| Example 17 | $HNO_3$ | 90.0 | HF | 0.500 | | | Water | 9.5 | <1 |
| Example 18 | $HNO_3$ | 85.0 | HF | 0.500 | | | Water | 14.5 | <1 |
| Comparative example 15 | $HNO_3$ | 95.0 | HF | 0.400 | | | Water | 4.6 | <1 |
| Comparative example 16 | $HNO_3$ | 65.0 | HF | 0.400 | | | Water | 34.6 | <1 |
| Comparative example 17 | $HNO_3$ | 65.0 | HF | 2.000 | | | Water | 33.0 | <1 |

TABLE 3

Composition containing aliphatic carboxylic acid and water.

Composition ratio of the residue-removing liquid composition

| | Component ① | mass % | Component ② | mass % | Component ③ | mass % | Component ④ | mass % | pH |
|---|---|---|---|---|---|---|---|---|---|
| Example 19 | MeOAcH[X16] | 98.5 | HF | 0.5 | | | Water | 1.0 | <1 |
| Example 20 | MeOAcH[X16] | 98.0 | HF | 0.7 | | | Water | 1.3 | <1 |
| Example 21 | $CH_3COOH$ | 96.5 | HF | 0.5 | | | Water | 3.0 | <1 |
| Example 22 | $C_2H_5COOH$ | 96.5 | HF | 0.5 | | | Water | 3.0 | <1 |
| Example 23 | MeOAcH[X16] | 95.0 | HF | 0.7 | | | Water | 4.3 | <1 |
| Example 24 | MeOAcH[X16] | 95.0 | HF | 0.5 | | | Water | 4.5 | <1 |
| Example 25 | MeOAcH[X16] $H_3PO_4$ | 90.0 8.0 | HF | 0.5 | | | Water | 1.5 | <1 |
| Example 26 | MeOAcH[X16] $H_3PO_4$ | 90.0 2.0 | HF | 0.5 | | | Water | 7.5 | <1 |
| Example 27 | LacH[X17] | 89.0 | HF | 0.5 | | | Water | 10.5 | <1 |
| Example 28 | ForH[X18] | 87.5 | HF | 0.5 | | | Water | 12.0 | <1 |
| Example 29 | AcH[X19] | 87.5 | HF | 0.5 | | | Water | 12.0 | <1 |
| Example 30 | PrH[X20] | 87.5 | HF | 0.5 | | | Water | 12.0 | <1 |
| Example 31 | AcrH[X21] | 87.5 | HF | 0.5 | | | Water | 12.0 | <1 |
| Example 32 | MeAcrH[X22] | 87.5 | HF | 0.5 | | | Water | 12.0 | <1 |
| Example 33 | HeH[X23] | 87.5 | HF | 0.5 | | | Water | 12.0 | <1 |
| Example 34 | LacH[X17] $H_3PO_4$ | 80.0 2.0 | HF | 0.5 | | | Water | 17.5 | <1 |
| Example 35 | LacH[X17] $H_3PO_4$ | 77.0 8.0 | HF | 0.5 | | | Water | 14.5 | <1 |
| Example 36 | MeOAcH[X16] | 80.0 | HF | 0.5 | | | Water | 19.5 | <1 |
| Example 37 | LacH[X17] | 80.0 | HF | 0.5 | | | Water | 19.5 | <1 |
| Comparative example 18 | MeOAcH[X16] | 56.0 | HF | 0.5 | | | Water | 43.5 | <1 |
| Comparative example 19 | LacH[X17] | 61.7 | HF | 0.5 | | | Water | 37.8 | <1 |
| Comparative example 20 | HAc[X9] | 5.0 | $NH_4F$ | 5.0 | | | Water | 90.0 | <1 |
| Comparative example 21 | GlyA[X12] | 0.06 | $NH_4F$ | 0.2 | | | Water | 99.74 | <1 |
| Comparative example 22 | | | $NH_4F$ | 1.0 | DMF[X2] TMAH-F[X1] | 40.0 10.0 | Water | 49.0 | <1 |
| Comparative example 23 | | | $NH_4F$ | 0.5 | DMAc[X11] AsA[X10] | 69.4 0.10 | Water | 30.0 | 4 |
| Comparative example 24 | | | | | CA[X5] HDA[X3] DGA[X4] | 5.0 20.0 55.0 | Water | 20.0 | 12 |
| Comparative example 25 | | | | | CA[X5] TMAH[X6] $H_2O_2$ | 5.0 10.0 4.0 | Water | 81.0 | 12 |
| Comparative example 26 | | | | | BuPA[X7] $(COONH_4)_2$ $H_2O_2$ | 2.0 2.5 2.5 | Water | 93.0 | 5 |

[X1] Tetramethylammonium formate
[X2] Dimethylformamide
[X3] Hydroxylamine
[X4] Diglycolamine
[X5] Catechol
[X6] Tetramethylammonium hydoxide
[X7] Butoxypropanol
[X8] Diethyleneglycol monomethylether
[X9] Acetic acid
[X10] Ascorbic acid
[X11] Dimethylacetamide
[X12] Glyoxylic acid
[X13] 3-Morpholino ethanesulfonic acid
[X16] Methoxyacetic acid
[X17] L-Lactic acid
[X18] ForH: Formic acid
[X19] AcH: Acetic acid
[X20] PrH: Propionic acid
[X21] AcrH: Acrylic acid
[X22] MeAcrH: Methacrylic acid
[X23] HeH: n-Hexanoic acid
[X24] OcH: n-Octanoic acid

TABLE 4

Composition containing aliphatic sulfonic acid and water.

Composition ratio of the residue-removing liquid composition

|  | Component ① | mass % | Component ② | mass % | Component ③ | mass % | Component ④ | mass % | pH |
|---|---|---|---|---|---|---|---|---|---|
| Example 38 | $CH_3SO_3H$ | 92.5 | HF | 3.0 |  |  | Water | 4.5 | <1 |
| Example 39 | $CH_3SO_3H$ | 92.5 | HF | 0.5 |  |  | Water | 7.0 | <1 |
| Example 40 | $CH_3SO_3H$ | 90.0 | HF | 2.0 |  |  | Water | 8.0 | <1 |
| Example 41 | $CH_3SO_3H$ | 90.0 | HF | 1.0 |  |  | Water | 9.0 | <1 |
| Example 42 | $CH_3SO_3H$ | 90.0 | HF | 0.5 |  |  | Water | 9.5 | <1 |
| Example 43 | $C_2H_5SO_3H$ | 87.5 | HF | 0.5 |  |  | Water | 12.0 | <1 |
| Example 44 | $CH_3SO_3H$ | 80.0 | HF | 0.5 |  |  | Water | 19.5 | <1 |
| Example 45 | $CH_3SO_3H$ | 70.0 | HF | 0.5 |  |  | Water | 29.5 | <1 |
| Comparative example 27 | $CH_3SO_3H$ | 95.0 | HF | 0.4 |  |  | Water | 4.6 | <1 |
| Comparative example 28 | $CH_3SO_3H$ | 65.0 | HF | 2.0 |  |  | Water | 33.0 | <1 |
| Comparative example 29 | $CH_3SO_3H$ | 65.0 | HF | 0.4 |  |  | Water | 34.6 | <1 |
| Comparative example 30 | $CH_3SO_3H$ | 1.0 | $NH_4F$ | 1.0 |  |  | Water | 98.0 | <1 |
| Comparative example 31 | $CH_3SO_3H$ | 1.0 | $NH_4F$ | 1.0 | DEGMME[※8] | 30.0 | Water | 68.0 | <1 |
| Comparative example 32 | MES[※13] | 1.0 | $NH_4F$ | 1.0 | DMAc[※11] | 68.0 | Water | 30.0 | <1 |

[※8]Diethyleneglycol monomethylether
[※11]Dimethylacetamide
[※13]3-Morpholino ethanesulfonic acid

TABLE 5

Composition wherein pH is changed by MeOAcH and NaOH.

Composition ratio of the residue-removing liquid composition

|  | Component ① | mass % | Component ② | mass % | Component ③ | mass % | Component ④ | mass % | pH |
|---|---|---|---|---|---|---|---|---|---|
| Example 46 | MeOAcH[※16] | 70.0 | HF | 0.5 | NaOH | 0.0 | Water | 29.5 | <1 |
| Example 47 | MeOAcH[※16] | 65.9 | HF | 0.5 | NaOH | 4.1 | Water | 29.5 | 2 |
| Example 48 | MeOAcH[※16] | 59.5 | HF | 0.5 | NaOH | 10.5 | Water | 29.5 | 3 |
| Example 49 | MeOAcH[※16] | 52.3 | HF | 0.5 | NaOH | 17.7 | Water | 29.5 | 4 |
| Comparative example 33 | MeOAcH[※16] | 48.7 | HF | 0.5 | NaOH | 21.3 | Water | 29.5 | 5 |
| Comparative example 34 | MeOAcH[※16] | 48.2 | HF | 0.5 | NaOH | 21.8 | Water | 29.5 | 6 |

[※16]Methoxyacetic acid

TABLE 6

Results of cleaning by composition containing sulfuric acid or phosphoric acid and water.

| | Wiring pattern | | | | | Via-hole pattern | | | | | | |
|---|---|---|---|---|---|---|---|---|---|---|---|---|
| | Removal capability[※14] | Attacking property[※15] | | | | Removal capability[※14] | | Attacking property[※15] | | | | |
| | Polymer residue | Al—Cu | TiN | Ti | p-TEOS | Polymer residue | Photoresist residue | Al—Cu | TiN | Ti | p-TEOS |
| Example 1 | ◎ | ○ | ◎ | ○ | ○ | ◎ | ◎ | ○ | ◎ | ○ | ○ |
| Example 2 | ◎ | ◎ | ◎ | ◎ | ◎ | ◎ | ◎ | ◎ | ◎ | ◎ | ◎ |
| Example 3 | ◎ | ○ | ◎ | ○ | ○ | ◎ | ◎ | ○ | ◎ | ○ | ○ |
| Example 4 | ◎ | ○ | ◎ | ○ | ○ | ◎ | ◎ | ○ | ◎ | ○ | ○ |
| Example 5 | ◎ | ◎ | ◎ | ◎ | ◎ | ◎ | ◎ | ◎ | ◎ | ◎ | ◎ |
| Example 6 | ◎ | ◎ | ◎ | ◎ | ◎ | ◎ | ◎ | ◎ | ◎ | ◎ | ◎ |
| Example 7 | ◎ | ◎ | ◎ | ◎ | ◎ | ○ | ◎ | ◎ | ◎ | ◎ | ◎ |
| Example 8 | ○ | ◎ | ◎ | ◎ | ○ | ○ | ◎ | ◎ | ◎ | ◎ | ○ |
| Example 9 | ◎ | ◎ | ◎ | ◎ | ◎ | ◎ | ◎ | ◎ | ◎ | ◎ | ◎ |
| Example 10 | ◎ | ◎ | ◎ | ◎ | ◎ | ◎ | ◎ | ◎ | ◎ | ◎ | ◎ |
| Example 11 | ◎ | ◎ | ◎ | ◎ | ◎ | ○ | ◎ | ◎ | ◎ | ◎ | ◎ |
| Example 12 | ◎ | ◎ | ◎ | ◎ | ◎ | ◎ | ◎ | ◎ | ◎ | ◎ | ◎ |
| Example 13 | ○ | ◎ | ◎ | ◎ | ◎ | ◎ | ◎ | ◎ | ◎ | ◎ | ◎ |
| Example 14 | ◎ | ◎ | ◎ | ◎ | ◎ | ◎ | ◎ | ◎ | ◎ | ◎ | ◎ |

TABLE 6-continued

Results of cleaning by composition containing sulfuric acid or phosphoric acid and water.

| | Wiring pattern | | | | | Via-hole pattern | | | | | |
|---|---|---|---|---|---|---|---|---|---|---|---|
| | Removal capability ※14 | Attacking property ※15 | | | | Removal capability ※14 | | Attacking property ※15 | | | |
| | Polymer residue | Al—Cu | TiN | Ti | p-TEOS | Polymer residue | Photoresist residue | Al—Cu | TiN | Ti | p-TEOS |
| Example 15 | ⊚ | ○ | ⊚ | ⊚ | ⊚ | ⊚ | ⊚ | ○ | ⊚ | ⊚ | ⊚ |
| Example 16 | ⊚ | ○ | ⊚ | ⊚ | ○ | ⊚ | ⊚ | ○ | ⊚ | ⊚ | ○ |
| Comparative example 1 | X | ⊚ | ⊚ | ⊚ | ⊚ | X | X | ⊚ | ⊚ | ⊚ | ⊚ |
| Comparative example 2 | X | ⊚ | ⊚ | ⊚ | ⊚ | X | X | ⊚ | ⊚ | ⊚ | ⊚ |
| Comparative example 3 | X | ⊚ | ⊚ | ⊚ | ⊚ | X | ⊚ | ⊚ | ⊚ | ⊚ | X |
| Comparative example 4 | ⊚ | X | ⊚ | X | X | ⊚ | ⊚ | X | ⊚ | X | X |
| Comparative example 5 | ⊚ | X | ⊚ | X | X | ⊚ | ⊚ | X | ⊚ | X | X |
| Comparative example 6 | ⊚ | X | ⊚ | X | X | ⊚ | ⊚ | X | ⊚ | X | X |
| Comparative example 7 | ⊚ | X | ⊚ | X | X | ⊚ | ⊚ | X | ⊚ | X | X |
| Comparative example 8 | ⊚ | X | ⊚ | X | X | ⊚ | ⊚ | X | ⊚ | X | X |
| Comparative example 9 | ⊚ | X | ⊚ | X | X | ⊚ | ⊚ | X | ⊚ | X | X |
| Comparative example 10 | ⊚ | X | ⊚ | X | X | ⊚ | ⊚ | X | ⊚ | X | X |
| Comparative example 11 | ⊚ | X | ⊚ | X | X | ⊚ | ⊚ | X | ⊚ | X | X |
| Comparative example 12 | ○ | ⊚ | ⊚ | ⊚ | ⊚ | X | X | ⊚ | ⊚ | ⊚ | ⊚ |
| Comparative example 13 | ○ | ⊚ | ⊚ | ⊚ | ⊚ | X | X | ⊚ | ⊚ | ⊚ | ⊚ |
| Comparative example 14 | X | ⊚ | ⊚ | ⊚ | ⊚ | X | X | ⊚ | ⊚ | ⊚ | ⊚ |

※14: ⊚ Good, ○ Fairly Good, Δ Residue slightly remained, X Removal impossible
※15: ⊚ Good, ○ Fairly Good, Δ Corrosion slightly developed, X Development of corrosion

TABLE 7

Results of cleaning by composition consisting of nitric acid, hydrofluoric acid and water.

| | Wiring pattern | | | | | Via-hole pattern | | | | | |
|---|---|---|---|---|---|---|---|---|---|---|---|
| | Removal capability ※1 | Attacking property ※15 | | | | Removal capability ※14 | | Attacking property ※15 | | | |
| | Polymer residue | Al—Cu | TiN | Ti | p-TEOS | Polymer residue | Photoresist residue | Al—Cu | TiN | Ti | p-TEOS |
| Example 17 | ○ | ⊚ | ⊚ | ○ | ○ | ⊚ | ⊚ | ⊚ | ⊚ | ○ | ⊚ |
| Example 18 | ○ | ⊚ | ⊚ | ⊚ | ○ | ⊚ | ⊚ | ⊚ | ⊚ | ⊚ | ○ |
| Comparative example 15 | Δ | ⊚ | ⊚ | ○ | ⊚ | Δ | ⊚ | ⊚ | ⊚ | ○ | ⊚ |
| Comparative example 16 | ⊚ | X | ⊚ | X | X | ⊚ | ⊚ | X | ⊚ | X | X |
| Comparative example 17 | ⊚ | X | ⊚ | X | X | ⊚ | ⊚ | X | ⊚ | X | X |

※14: ⊚ Good, ○ Fairly Good, Δ Residue slightly remained, X Removal impossible
※15: ⊚ Good, ○ Fairly Good, Δ Corrosion slightly developed, X Development of corrosion

TABLE 8

Results of cleaning by composition containing aliphatic carboxylic acid and water.

| | Wiring pattern | | | | | Via-hole pattern | | | | | |
|---|---|---|---|---|---|---|---|---|---|---|---|
| | Removal capability※1 | Attacking property※15 | | | | Removal capability※14 | | Attacking property※15 | | | |
| | Polymer residue | Al—Cu | TiN | Ti | p-TEOS | Polymer residue | Photoresist residue | Al—Cu | TiN | Ti | p-TEOS |
| Example 19 | ⊚ | ⊚ | ⊚ | ⊚ | ○ | ○ | ○ | ⊚ | ⊚ | ⊚ | ⊚ |
| Example 20 | ⊚ | ⊚ | ⊚ | ⊚ | ⊚ | ○ | ⊚ | ⊚ | ⊚ | ⊚ | ⊚ |
| Example 21 | ⊚ | ○ | ⊚ | ⊚ | ○ | ⊚ | ⊚ | ○ | ⊚ | ⊚ | ○ |
| Example 22 | ⊚ | ○ | ⊚ | ⊚ | ⊚ | ⊚ | ⊚ | ○ | ⊚ | ⊚ | ⊚ |
| Example 23 | ⊚ | ○ | ⊚ | ○ | ⊚ | ⊚ | ⊚ | ○ | ⊚ | ○ | ⊚ |
| Example 24 | ⊚ | ⊚ | ⊚ | ⊚ | ⊚ | ⊚ | ⊚ | ⊚ | ⊚ | ⊚ | ⊚ |
| Example 25 | ⊚ | ⊚ | ⊚ | ⊚ | ⊚ | ○ | ⊚ | ⊚ | ⊚ | ⊚ | ⊚ |
| Example 26 | ⊚ | ⊚ | ⊚ | ⊚ | ⊚ | ○ | ⊚ | ⊚ | ⊚ | ⊚ | ⊚ |
| Example 27 | ⊚ | ⊚ | ⊚ | ⊚ | ⊚ | ⊚ | ⊚ | ⊚ | ⊚ | ⊚ | ⊚ |
| Example 28 | ⊚ | ○ | ⊚ | ⊚ | ⊚ | ⊚ | ⊚ | ○ | ⊚ | ⊚ | ⊚ |
| Example 29 | ⊚ | ○ | ⊚ | ○ | ⊚ | ⊚ | ⊚ | ○ | ⊚ | ○ | ⊚ |
| Example 30 | ⊚ | ○ | ⊚ | ○ | ⊚ | ⊚ | ⊚ | ○ | ⊚ | ○ | ⊚ |
| Example 31 | ⊚ | ○ | ⊚ | ○ | ○ | ⊚ | ⊚ | ○ | ⊚ | ○ | ○ |
| Example 32 | ⊚ | ○ | ⊚ | ○ | ○ | ⊚ | ⊚ | ○ | ⊚ | ○ | ○ |
| Example 33 | ⊚ | ○ | ⊚ | ○ | ○ | ⊚ | ⊚ | ○ | ⊚ | ○ | ○ |
| Example 34 | ⊚ | ⊚ | ⊚ | ⊚ | ⊚ | ○ | ⊚ | ⊚ | ⊚ | ⊚ | ⊚ |
| Example 35 | ⊚ | ⊚ | ⊚ | ⊚ | ⊚ | ○ | ⊚ | ⊚ | ⊚ | ⊚ | ⊚ |
| Example 36 | ⊚ | ○ | ⊚ | ⊚ | ⊚ | ⊚ | ⊚ | ○ | ⊚ | ⊚ | ⊚ |
| Example 37 | ⊚ | ○ | ⊚ | ○ | ⊚ | ⊚ | ⊚ | ⊚ | ⊚ | ⊚ | ⊚ |
| Comparative example 18 | ⊚ | X | ⊚ | X | X | ⊚ | ⊚ | X | ⊚ | X | X |
| Comparative example 19 | ⊚ | X | ⊚ | X | X | ⊚ | ⊚ | X | ⊚ | X | X |
| Comparative example 20 | X | ⊚ | ⊚ | ⊚ | ⊚ | X | X | ⊚ | ⊚ | ⊚ | ⊚ |
| Comparative example 21 | X | ⊚ | ⊚ | ⊚ | ⊚ | X | X | ⊚ | ⊚ | ⊚ | ⊚ |
| Comparative example 22 | X | ⊚ | ⊚ | ⊚ | ⊚ | X | X | ⊚ | ⊚ | ⊚ | ⊚ |
| Comparative example 23 | X | ⊚ | ⊚ | ⊚ | ⊚ | X | X | ⊚ | ⊚ | ⊚ | ⊚ |
| Comparative example 24 | X | ⊚ | ⊚ | ⊚ | ⊚ | X | X | ⊚ | ⊚ | ⊚ | ⊚ |
| Comparative example 25 | X | ⊚ | ⊚ | ⊚ | ⊚ | X | X | ⊚ | ⊚ | ⊚ | ⊚ |
| Comparative example 26 | X | ⊚ | ⊚ | ⊚ | ⊚ | X | X | ⊚ | ⊚ | ⊚ | ⊚ |

※14: ⊚ Good, ○ Fairly Good, △ Residue slightly remained, X Removal impossible
※15: ⊚ Good, ○ Fairly Good, △ Corrosion slightly developed, X Development of corrosion

TABLE 9

Results of cleaning by composition containing aliphatic sulfonic acid and water.

| | Wiring pattern | | | | | Via-hole pattern | | | | | |
|---|---|---|---|---|---|---|---|---|---|---|---|
| | Removal capability※1 | Attacking property※15 | | | | Removal capability※14 | | Attacking property※15 | | | |
| | Polymer residue | Al—Cu | TiN | Ti | p-TEOS | Polymer residue | Photoresist residue | Al—Cu | TiN | Ti | p-TEOS |
| Example 38 | ⊚ | ○ | ⊚ | ○ | ○ | ⊚ | ⊚ | ○ | ⊚ | ○ | ○ |
| Example 39 | ⊚ | ⊚ | ⊚ | ⊚ | ⊚ | ⊚ | ⊚ | ⊚ | ⊚ | ⊚ | ⊚ |
| Example 40 | ⊚ | ○ | ⊚ | ○ | ○ | ⊚ | ⊚ | ○ | ⊚ | ○ | ○ |
| Example 41 | ⊚ | ○ | ⊚ | ○ | ○ | ⊚ | ⊚ | ○ | ⊚ | ○ | ○ |
| Example 42 | ⊚ | ⊚ | ⊚ | ⊚ | ⊚ | ⊚ | ⊚ | ⊚ | ⊚ | ⊚ | ⊚ |
| Example 43 | ⊚ | ⊚ | ⊚ | ⊚ | ⊚ | ⊚ | ⊚ | ⊚ | ⊚ | ⊚ | ⊚ |
| Example 44 | ⊚ | ○ | ⊚ | ⊚ | ⊚ | ⊚ | ⊚ | ○ | ⊚ | ⊚ | ⊚ |
| Example 45 | ⊚ | ○ | ⊚ | ○ | ○ | ⊚ | ⊚ | ○ | ⊚ | ○ | ○ |
| Comparative example 27 | X | ⊚ | ⊚ | ⊚ | ⊚ | X | X | ⊚ | ⊚ | ⊚ | ⊚ |
| Comparative example 28 | ⊚ | X | ⊚ | X | X | ⊚ | ⊚ | X | ⊚ | X | X |

TABLE 9-continued

Results of cleaning by composition containing aliphatic sulfonic acid and water.

| | Wiring pattern | | | | | Via-hole pattern | | | | | |
|---|---|---|---|---|---|---|---|---|---|---|---|
| | Removal capability·※1 | Attacking property·※15 | | | | Removal capability·※14 | | Attacking property·※15 | | | |
| | Polymer residue | Al—Cu | TiN | Ti | p-TEOS | Polymer residue | Photoresist residue | Al—Cu | TiN | Ti | p-TEOS |
| Comparative example 29 | ◎ | X | ◎ | X | X | ◎ | ◎ | X | ◎ | X | X |
| Comparative example 30 | ○ | ◎ | ◎ | ◎ | ◎ | X | Δ | ◎ | ◎ | ◎ | ◎ |
| Comparative example 31 | ○ | ◎ | ◎ | ◎ | ◎ | X | Δ | ◎ | ◎ | ◎ | ◎ |
| Comparative example 32 | X | ◎ | ◎ | ◎ | ◎ | X | X | ◎ | ◎ | ◎ | ◎ |

※14: ◎ Good, ○ Fairly Good, Δ Residue slightly remained, X Removal impossible
※15: ◎ Good, ○ Fairly Good, Δ Corrosion slightly developed, X Development of corrosion

TABLE 10

Results of cleaning by composition in which pH is changed by MeOAcH and NaOH.

| | Wiring pattern | | | | | Via-hole pattern | | | | | |
|---|---|---|---|---|---|---|---|---|---|---|---|
| | Removal capability·※1 | Attacking property·※15 | | | | Removal capability·※14 | | Attacking property·※15 | | | |
| | Polymer residue | Al—Cu | TiN | Ti | p-TEOS | Polymer residue | Photoresist residue | Al—Cu | TiN | Ti | p-TEOS |
| Example 46 | ◎ | ○ | ◎ | ◎ | ○ | ◎ | ◎ | ○ | ◎ | ○ | ○ |
| Example 47 | ◎ | ◎ | ◎ | ◎ | ◎ | ◎ | ◎ | ◎ | ◎ | ◎ | ◎ |
| Example 48 | ○ | ◎ | ◎ | ◎ | ◎ | ○ | ◎ | ◎ | ◎ | ◎ | ◎ |
| Example 49 | ○ | ◎ | ◎ | ◎ | ○ | ○ | ◎ | ◎ | ◎ | ◎ | ◎ |
| Comparative example 3 | Δ | ◎ | ◎ | ◎ | ○ | X | ○ | ◎ | ◎ | ◎ | ◎ |
| Comparative example 3 | X | ◎ | ◎ | ◎ | ○ | X | Δ | ◎ | ◎ | ◎ | ◎ |

※14: ◎ Good, ○ Fairly Good, Δ Residue slightly remained, X Removal impossible
※15: ◎ Good, ○ Fairly Good, Δ Corrosion slightly developed, X Development of corrosion

INDUSTRIAL APPLICABILITY

The liquid composition for removing a photoresists residue and a polymer residue of the present invention can remove photoresist residues and polymer residues generated by ashing of photoresists after dry etching, at low temperature and within a short time; therefore, in a manufacturing process of semiconductor circuit elements having metal wiring, the inventive composition enables to remove residues using a single wafer cleaning apparatus which requires low-temperature and short-time processing.

REFERENCE SIGNS LIST

1. Underlying oxide film
2,4,8. Barrier metal layer
3. Metal layer
5,10. Mask
6,11. Photoresist residue and polymer residue
7. Line width reduction
9. Interlayer insulating film
12. Embedded metal layer
21. Insulating film
22. Embedded wiring

The invention claimed is:

1. A composition for removing a photoresist residue and/or a polymer residue generated in a manufacturing process of semiconductor circuit elements having metal wiring, wherein the composition consists of 0.5-3.0 mass % of a fluorine compound, 30 mass % or less of water, and one or more inorganic acids and/or organic acids selected from the group consisting of (1) sulfuric acid, (2) phosphoric acid, (3) sulfuric acid and hydrochloric acid, (4) sulfuric acid and perchloric acid, (5) sulfuric acid and tetraboric acid, (6) aliphatic carboxylic acid, (7) phosphoric acid and aliphatic carboxylic acid selected from propionic acid, methoxyacetic acid, lactic acid, and n-hexanoic acid, or (8) aliphatic sulfonic acid and phosphoric acid, and wherein the composition has a pH value of 4 or less.

2. The composition according to claim 1, wherein the fluorine compound is one or more kinds selected from the group consisting of hydrofluoric acid, hexafluorosilicic acid, and tetrafluoroboric acid.

3. The composition according to claim 1, wherein the total amount of the inorganic acids and/or organic acids is 70 mass % or more.

4. The composition according to claim 1, wherein the metal wiring is one or more kinds selected from the group consisting of aluminum, copper, tungsten, titanium, and an alloy having these metals as a major component.

5. A method for removing a photoresist residue and/or a polymer residue generated in a manufacturing process of semiconductor circuit elements having metal wiring, comprising using a composition for removing a photoresist residue and/or a polymer residue generated in a manufacturing process of semiconductor circuit elements having metal wiring, wherein the composition comprises 0.5-3.0 mass % of a fluorine compound and 30 mass % or less of water, and has a pH value of 4 or less.

6. The method according to claim 5, wherein the fluorine compound is one or more kinds selected from the group consisting of hydrofluoric acid, hexafluorosilicic acid, and tetrafluoroboric acid.

7. The method according to claim 6, wherein the composition comprises one or more inorganic acids and/or organic acids.

8. The method according to claim 7, wherein the inorganic acid and/or organic acid is any one of (1) sulfuric acid, (2) phosphoric acid, (3) nitric acid, (4) sulfuric acid and hydrochloric acid, (5) sulfuric acid and perchloric acid, (6) sulfuric acid and tetraboric acid, (7) aliphatic carboxylic acid, (8) aliphatic carboxylic acid and phosphoric acid, (9) aliphatic sulfonic acid, or (10) aliphatic sulfonic acid and phosphoric acid.

9. The method according to claim 8, wherein the total amount of the inorganic acids and/or organic acids is 70 mass % or more.

10. The method according to claim 9, wherein the metal wiring is one or more kinds selected from the group consisting of aluminum, copper, tungsten, titanium, and an alloy having these metals as a major component.

11. The composition according to claim 3, wherein the metal wiring is one or more kinds selected from the group consisting of aluminum, copper, tungsten, titanium, and an alloy having these metals as a major component.

* * * * *